United States Statutory Invention Registration [19]

[11] Reg. Number: H872

Hendricks [43] Published: Jan. 1, 1991

[54] METHOD OF APPLYING COATINGS TO SUBSTRATES

[75] Inventor: Charles D. Hendricks, Livermore, Calif.

[73] Assignee: The United States of America as represented by the Department of Energy, Washington, D.C.

[21] Appl. No.: 96,200

[22] Filed: Sep. 15, 1987

[51] Int. Cl.[5] ..... B05D 3/06

[52] U.S. Cl. ..... 427/53.1; 427/36; 427/42; 204/197.41; 204/157.61; 204/192.31

[58] Field of Search ..... 427/53.1, 35, 36, 37, 427/42, 43.1, 30; 204/192.31, 192.11, 157.41, 157.61

[56] References Cited

U.S. PATENT DOCUMENTS

| | | | |
|---|---|---|---|
| 4,152,478 | 5/1979 | Takagi | 204/192.31 |
| 4,264,641 | 4/1981 | Mahoney et al. | 427/27 |
| 4,281,030 | 7/1981 | Silfuast | 427/53.1 |
| 4,427,723 | 1/1984 | Swain | 427/53.1 |
| 4,652,357 | 3/1987 | Colligan et al. | 204/192.31 |
| 4,693,760 | 9/1989 | Sioshansi | 204/192.31 |
| 4,740,386 | 4/1988 | Cheung | 427/53.1 |
| 4,748,043 | 5/1988 | Seaver et al. | 429/30 |
| 4,762,975 | 8/1988 | Mahoney et al. | 427/30 |

FOREIGN PATENT DOCUMENTS

| | | | |
|---|---|---|---|
| 0113537 | 7/1984 | European Pat. Off. | 427/30 |

*Primary Examiner*—Peter A. Nelson
*Attorney, Agent, or Firm*—L. E. Carnahan; Roger S. Gaither; Judson R. Hightower

[57] ABSTRACT

A method for applying novel coatings to substrates is provided. The ends of a multiplicity of rods of different materials are melted by focused beams of laser light. Individual electric fields are applied to each of the molten rod ends, thereby ejecting charged particles that include droplets, atomic clusters, molecules, and atoms. The charged particles are separately transported, by the accelerations provided by electric potentials produced by an electrode structure, to substrates where they combine and form the coatings. Layered and thickness graded coatings comprised of hithereto unavailable compositions, are provided.

1 Claim, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF APPLYING COATINGS TO SUBSTRATES

The U.S. Government has rights to this invention pursuant to Contract No. w-7405-ENG-48 between the U.S. Department of Energy and the University of California, for the operation of Lawrence Livermore National Laboratory.

BACKGROUND OF THE INVENTION

The invention described herein relates generally to methods for applying coatings to substrates, and more particularly to methods for applying regulated composite coatings, of uniform or variable composition and configuration, onto a wide variety of solid, or even liquid, substrate surfaces, and to the unique coatings produced by these methods.

There presently exist a wide variety of methods for applying coatings to substrates. Many of these methods require the coating material to be melted or vaporized, or even ionized, while being physically restrained in some manner, as for example by being melted in a crucible or vaporized and passed through a nozzle. For some chemically reactive materials, or materials with very high melting temperatures, crucibles and nozzles are not practically available. However, even when available, they often act as a contaminant source for the resulting coating, and further, being costly and short lived, greatly add to the expense of the coating operation.

In the well known fundamental technique of coating by vapor deposition, the coating material is melted and evaporated, with a coating formed by the subsequent condensation of the vapor upon a substrate. There are many known variations to this basic technique. For example, Blum et al in U.S. Pat. No. 4,451,503 issued May 29, 1984, teaches a process where metal carbonyl is heated in a reaction chamber to produce metal compound vapors that are photodecomposed by ultraviolet radiation of wavelengths less than 200 nm. The released metal atoms are condensed onto a substrate. Matsuda et al in U.S. Pat. No. 4,569,855 issued Feb. 11, 1986, discloses a process for forming a deposition film, containing silicon atoms, on a substrate, by exciting and decomposing a gaseous silicon compound with light energy. Tanaka et al in U.S. Pat. No. 4,604,294 issued Aug. 5, 1986, teaches the vacuum vapor deposition of an organic compound. The compound is vaporized by a laser beam having an energy level corresponding to that of the chemical bond of the organic compound. Swain in U.S. Pat. No. 4,427,723 issued Jan. 24, 1984, discloses a method and apparatus for vacuum deposition and annealing, wherein a coating material is evaporated by a first laser beam, while a second laser beam locally heats the substrate to promote annealing and contaminant elimination of the resulting coating.

In a related area of coating technology, there presently exist various ion sources that may be used, for example, to implant ions in assorted materials. For instance, Umemura et al in U.S. Pat. No. 4,624,833 issued Nov. 25, 1986, teaches a liquid metal ion source wherein a source material is melted, by resistance heating or by a laser beam, and held in a reservoir. The melted source material is fed from the reservoir to a separated emitter, from which ions are ejected under a high electric field. It is pointed out that the source material must be properly selected so that it does not react violently with the emitter, and thus stop the ion extraction process. Because of this consideration, source materials are limited to various copper alloys.

Particle implantation is also taught by Bruel et al in U.S. Pat. No. 4,585,945 issued Apr. 29, 1986. In this teaching a beam of high energy particles are shot into a cloud of secondary particles, to impart energy to the secondary particles, and thus enable them to penetrate a metal substrate.

Once particles or ion beams have been produced, there presently exist many known processes for their subsequent manipulation. For example, Ashkin et al in U.S. Pat. No. 4,092,535 issued May 30, 1978 disclose an improved optical device for the levitation of a particle in vacuum; and Dalglish in U.S. Pat. No. 4,464,573 issued Aug. 7, 1984, teaches a charged particle beam focusing device wherein a pair of rod-like electrodes, of different electrical potential, are arranged on either side of the focused beam.

An apparatus and a method for depositing ionized clusters, consisting of 100 to 1000 atoms, on a substrate are disclosed by Takagi in U.S. Pat. No. 4,152,478 issued May 1, 1979, and in U.S. Pat. No. 4,217,855 issued Aug. 19, 1980. The material to be deposited is heated within a sealed crucible having one or more nozzles. The vapor of the material is ejected through the nozzles and into a low pressure region that surrounds the crucible. The resulting adiabatic expansion forces the vapor into a supercooled state that results in the formation of vapor aggregates or clusters. The clusters are then ionized by electron bombardment, and provided with kinetic energy by an extractor electrode that is held at a negative potential.

In other technology, first described by Zeleny in Phys. Rev. 10, 1 (1917), it is well known that an electric field applied to the surface of a liquid can distort the fluid surface and cause the ejection of charged droplets or even, as later discovered, multiatomic particles or single atoms. This effect is caused by the electric field producing forces which interact on the material additionally with the gravity forces, internal molecular and atomic binding forces, and surface tension forces, that are normally present in any liquid. These forces all interact to form a dynamic pressure distribution on the surface of the liquid that is functional of the local radius of curvature of the fluid surface. Small quantities of the liquid are forced to flow into regions within which the local radius of curvature is impelled to rapidly diminish, and are ejected from the fluid surface as droplets. It is very difficult, if not impossible, to precisely control the size distribution of the particles produced by this method. .he technique is very well-known and, to name a few of its applications, has been used in printing, ion etching, pattern deposition and ion implantation.

For example, Hendricks in U.S. Pat. No. 3,582,958 issued June 1, 1971 discloses a printer having an ion beam source in which a beam of large or small, single or multiatomic ions are extracted from a liquid surface by an electric field. The beam is directed upon a web, to impress a message upon the web.

The early activity in this art of particle production was all carried out using media that are liquid at normal room temperature, such as water, ink, glycerol and mercury. In later applications, however, as exemplified by the teaching of Mahoney et al in U.S. Pat. No. 4,264,641 issued Apr. 28, 1981, metal droplets have been formed by the application of an intense electric field to the liquid surface of a molten metal. In Mahoney et al, the metal is melted by a crucible heater and placed in a refractory reservoir, from which it is drawn into a refractory nozzle that terminates in a short capillary tip. when the molten metal approaches the nozzle tip, it enters a region of intense electric field established by the application of high positive voltage to the nozzle. The electric field is maintained between the positive nozzle and an extractor electrode that is held at a negative potential. Both the molten metal surface and the nozzle tip are bombarded by backstreaming electrons emitted from the extractor electrode. Additional backstreaming electrons can be emitted from the extracted metal droplets themselves, or from small plasmas formed from the droplets. Backstreaming electrons heat the molten metal surface and create a runaway condition wherein the heating process is not under control. However, in some applications, negatively biased thermionic electron emitters have been specifically used to provide electrons to heat the metal surface and keep it molten during high electric field particle extraction. Nevertheless, where uncontrolled backstreaming electrons are present, as is often the case, they can heat and melt the nozzle tip itself, even though it be made of a refractory ceramic or some other high-melting-point material such as stainless steel. When this happens, the material of the nozzle tip intermixes with and contaminates the metal droplets which the process is seeking to produce.

In my U.S. patent application Ser. No. 911,847 filed Sept. 26, 1986, issued Sept. 27, 1988 as U.S. Pat. No. 4,774,037 and titled "Method For Producing Solid or Hollow Spherical Particles Of Chosen Chemical Composition and of Uniform Size," I provide a method for producing large quantities of high melting temperature solid or hollow spherical particles of a predetermined chemical composition and having a uniform and controlled size distribution. An end of a solid or hollow rod of the material is rendered molten by a laser beam. Because of this, there is no possibility of the molten rod material becoming contaminated with extraneous material. In various aspects of the invention, an electric field is applied to the molten rod end, and/or the molten rod end is vibrated. In a further aspect of the invention, a high-frequency component is added to the electric field applied to the molten end of the rod. By controlling the internal pressure of the rod (when the rod is hollow), the rate at which the rod is introduced into the laser beam, the environment of the process, the vibration amplitude and frequency of the molten rod end, the electric field intensity applied to the molten rod end, and the frequency and intensity of the component added to the electric field, the uniformity and size distribution of the solid or hollow spherical particles produced by the inventive method are controlled. The polarity of the electric field applied to the molten rod end can be chosen to eliminate backstreaming electrons, which tend to produce run-away heating in the rod, from the process.

It is, thus, apparent that the presently existing methods for applying coatings to substrates are unsatisfactory in regard to providing pure coatings of materials having a very high melting temperature. The prior art is also wanting in regard to providing a methodology for the production of coatings created from charged clusters of atoms. It generally appears that the prior art of coating substrates is seriously inadequate in that regulated multi-material composite coatings of variable composition and configuration frequently cannot be provided. The prior art is, further, apparently lacking with regard to the deposition of coatings onto liquid surfaces.

SUMMARY OF THE INVENTION

It is, therefore, an object of the invention to provide pure coatings, and methods of applying pure coatings, especially when the materials of which the coatings are comprised have a very high melting temperature.

Another object of the invention is to provide coatings created from charged droplets, charged atomic clusters, charged single molecules, and/or charged single atoms, as well as methods for applying these coatings.

Yet another object of the invention is to provide regulated, multi-material, composite coatings of variable composition and configuration, and methods for applying these coatings.

A further object of the invention is to provide a method for applying coatings onto liquid surfaces.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, a coating may be applied to a substrate by melting an end of a rod with a focused beam of laser light, applying an electric field to the molten end of the rod to eject charged particles therefrom, and transporting the charged particles to the substrate to form the coating. The rod is preferably comprised of one or more materials selected from the group consisting of any refractory, any metal, any glass, any polymeric substance, and any inorganic salt. The method is often preferably carried out in a controlled environment, and the charged particles are preferably droplets, atomic clusters, single molecules, or single atoms. It is preferable to transport the charged particles to the substrate by accelerating, focusing, and directing them by means of the electric potentials produced by an electrode structure. Pure coatings of very high melting temperature, as well as coatings for liquid surfaces, may be produced by this inventive method.

The methodology of this invention is directly extended to a related embodiment wherein a multiplicity of rods, each comprised of a different material, may be used to form composite coatings on a wide variety of substrates. In this embodiment, the ends of a multiplicity of two or more rods, with each rod preferably comprised of one or more materials selected from the group consisting of any refractory, any metal, any glass, any polymeric substance, and any inorganic salt, are each melted with an individually applied, focused beam of laser light. when an individual electric field is separately applied to each molten rod end, charged particles, which are preferably droplets, atomic clusters, single molecules, or single atoms, are separately ejected from each of the molten rod ends. The charged particles combine to form a multi-material, composite coating, when they are transported to a substrate. The method is intended for use in a controlled environment, and preferably employs an electrode structure to produce the system of electric potentials that accelerate, focus, and direct the charged particles to the substrate.

By controlling, in the process described in the preceeding paragraph, both the individual intensities of each of the multiplicity of electric fields used in charged particle ejection, and also the configurations of each of the individual electric potential systems used to transport the charged particles ejected from each of the multiplicity of molten rod ends to the substrate, a further embodiment of the invention is achieved wherewith regulated, multi-material, composite coatings of variable composition and configuration may be provided.

The benefits and advantages of the present invention, as embodied and broadly described herein, include, inter alia, methods of applying coatings to substrates, and the novel coatings produced thereby. The coatings may be of high purity and comprised of materials having a very high melting temperature. Since the coatings are formed of charged droplets, charged atomic clusters, charged single molecules, and/or charged single atoms, that are ejected from a multiplicity of rods comprised of different materials, and that are laid down or deposited in a controlled and ordered manner, regulated, multi-material, composite coatings of variable composition and configuration are provided. Additionally, coatings of this invention may be applied onto liquid surfaces.

BRIEF DESCRIPTION OF THE DRAWINGS

The accompanying drawings, which are incorporated in and form a part of the specification, illustrate related embodiments of the invention and, together with the description, serve to explain the principles of the invention. In the drawings.

DETAILED DESCRIPTION OF THE INVENTION

Reference will now be made in detail to the present preferred embodiment of the invention, an example of which is illustrated in the accompanying drawings. A very important part of the present invention resides in utilizing laser light to heat and render molten high-melting-point materials such as refractories, metals, and glasses. Because of this, rods of coating materials can be easily stored and manipulated prior to their being selectively and locally melted in a very controlled manner. This eliminates the need for elaborate crucible heaters and reservoirs, refractory nozzles and capillary tips, and the like, from the coating process.

Figure 1:
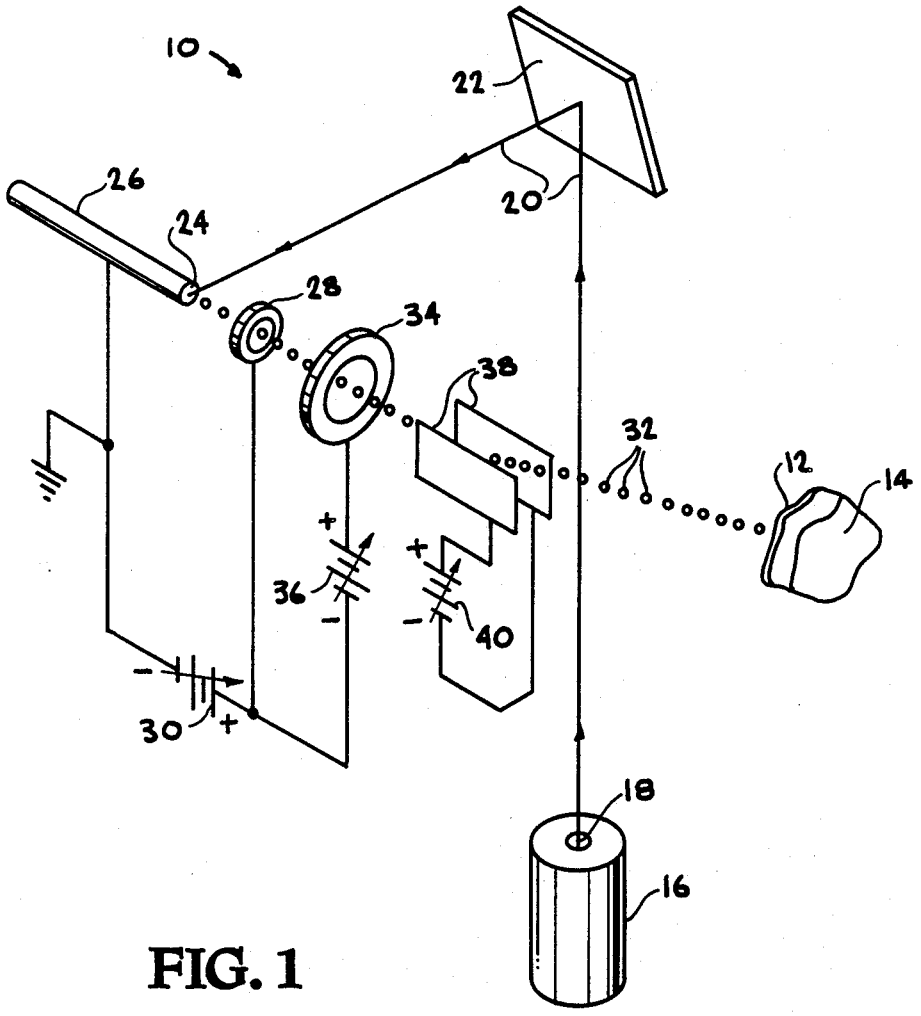
FIG. 1 is a schematic perspective view of an embodiment of apparatus for applying a coating to a substrate, in accordance with the method of this invention.

Reference is first made to FIG. 1 which is a schematic and perspective view of an apparatus 10 for applying a coating 12 to a substrate 14, in accordance with the method of this invention. A laser 16, equipped with a focusing element 18, produces a focused beam of laser light 20. Laser 16 may be Cw or pulsed, and may be of virtually any type such as $CO_2$, nitrogen, argon ion, YAG, or DYE. Laser 16 may have any wavelength that is not totally reflective on the material sought to be melted. The power level of laser 16 will usually vary from a few watts to several hundreds of watts, thereby providing a power level sufficient to melt most materials. Laser beam 20 may be reflected and redirected by any convenient and appropriate means such as, for example, by a mirror 22 which is schematically represented. An end 24 of a rod 26 is shown as introduced into laser beam 20, which has sufficient power to melt the rod material. Rod 26 may consist of virtually any material, including any refractory, any metal, any glass, any polymeric substance, any inorganic salt, or any compounds or mixtures thereof. These materials are defined in many standard reference texts, such as "webster's Third New International Dictionary", published by the G. and C. Merriam Company, which is hereby incorporated by reference. As specific examples of applications of the present inventive methodology, silver bearing alloy has been deposited onto hollow glass spheres. Also, coatings of tin, stainless steel, nickel, silver, aluminum, tungsten and tantalum may be deposited onto copper, stainless steel, steatite (an insulating porcelain), polyethylene and glass. In particular, the technique may be used to deposit coatings onto amorphous selenium and silicon. Usually, rod 26 will have a diameter in the approximate range from 0.010 inches to 0.25 inches and any length in excess of about 0.4 inches, but in various applications rod 26 may be configured as any slender bar. Rod 26 is grounded, as shown, and electrically connected to an electrode 28, schematically shown as a ring, via a variable power supply 30. Power supply 30 may be any D.C. power supply rated from 0 to 100 kV and up to 20 ma. Power supplies are very well-known and extensively used in the electronic arts. with the polarity shown, variable power supply 30 causes rod 26 to be at a negative electrical voltage with respect to ring electrode 28, so that an electric field is produced that is directed into molten rod end 24. This electric field, which is in the range extending up to approximately $10^8$ volts per meter, causes the ejection of charged particles 32, which may be droplets, atomic clusters comprised of several atoms, single molecules, or single atoms, from molten rod end 24. In other embodiments of the invention similar to that of FIG. 1, except for having the polarity of power supply 30 reversed, charged particles similar to charged particles 32 will also be produced. The charged particles 32 are linearly accelerated, or given kinetic energy, by disk electrode 34, which is placed at a positive voltage with respect to ring electrode 28, by variable power supply 36. Electrode 34 and power supply 36 are electrically connected as shown. Power supply 36 may be D.C., and rated from 0 to 100 kV, and up to 50 ma. Charged particles 32 are given a transverse acceleration by sweep plates 38, driven by a variable power supply 40, electrically connected as shown. Power supply 40 may be D.C. with an output voltage that is either stepped or varied at a relatively rapid rate by standard techniques that are well known in the prior art, or power supply 40 may be A.C. with established waveforms such as sawtooth, triangular or sinusoidal. The voltage of power supply 40 may extend to 5 kV, or higher, as appropriate for required particle deflection. Taken together, disk electrode 34 and sweep plates 38 constitute an electrode structure that produces electric potentials that accelerate and transport charged particles 32 onto substrate 14 to form the coating 12. The apparatus 10 may be frequently used in a controlled environment, such as in a vacuum or within an inert gas.

Another very important part of the invention resides in the simultaneous utilization of a multiplicity of apparatuses, each similar to apparatus 10, and each utilizing a rod of a different material, in the practice of processes to produce regulated, multi-material, composite coatings of variable composition and configuration. Since each rod is individually and efficiently melted by its own dedicated, focused laser beam, without cross-contamination and without the need for cumbersome heaters, crucibles, reservoirs, transport systems, and the like, many different and usually incompatible materials may be simultaneously combined in the fabrication of tailored coatings of unique character.

Figure 2:
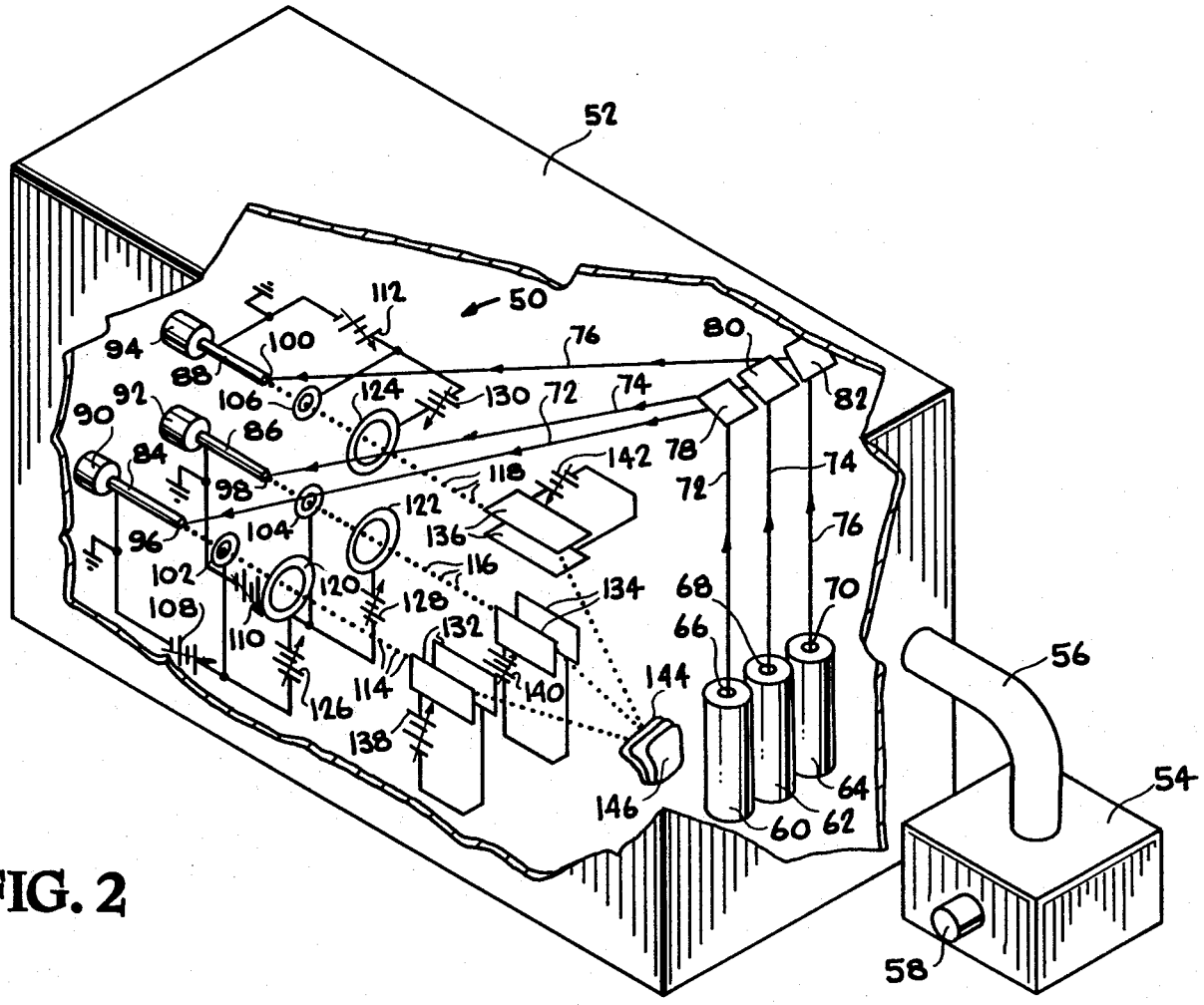
FIG. 2 is a schematic perspective view of apparatus, for use in a controlled environment, for applying a coating to a substrate, in accordance with the method of this invention.

Reference is now made to FIG. 2 which is a schematic perspective drawing of the presently preferred embodiment of this invention, depicting apparatus for carrying out a method for applying coatings to substrates. An apparatus 50 functions within a controlled environment provided by a hollow housing 52, the interior atmosphere and pressure of which are controlled by an environmental apparatus 54 that communicates with hollow housing 52 via a pipe 56, all schematically indicated. A control knob 58 for apparatus 54 is also schematically indicated. In practice, environmental apparatus 54 may be a vacuum pump or means for producing an inert atmosphere, such as for example a turbomolecular high vacuum pump, a diffusion pump, or a standard regulator and gas supply bottles, all of which are very well known. Means for producing controlled atmospheres or vacuums within confined spaces are very well known in the mechanical, electrical and chemical arts, and the environment within housing 52 may be controlled by any appropriate means. A multiplicity of three lasers 60, 62 and 64, equipped respectively with a multiplicity of three focusing elements 66, 68, and 70, produce respectively a multiplicity of three focused beams of laser light 72, 74 and 76. Although lasers 60, 62 and 64 are shown within housing 52, in other embodiments of the invention laser beams may be produced at any convenient location external to housing 52, and introduced into the interior of housing 52 by any appropriate means such as, for example, through a transparent window, not shown. Lasers 60, 62 and 64 are each of the same type as laser 16 of FIG. 1, and the description of laser 16, supra, is equally applicable to lasers 60, 62 and 64. Even though three lasers are shown in FIG. 2, the invention is certainly not limited to that specific multiplicity, but rather any convenient number of driving lasers together with their related apparatus may be beneficially utilized in the practice of this invention. As schematically represented, laser beams 72, 74 and 76 may be reflected and redirected by any convenient means such as, for example, respectively by a multiplicity of mirrors 78, 80 and 82. A multiplicity of three rods 84, 86 and 88 are respectively supported by a multiplicity of rod supports 90, 92 and 94. Rods 84, 86 and 88 are each comprised of a different material, and the description of rod 26, supra, FIG. 1, with respect to both size and composition, is equally applicable to each of rods 84, 86 and 88. More specifically, each of rods 84, 86 and 88 may consist of virtually any material, including any refractory, any metal, any glass, any polymeric substance, any inorganic salt, or any compounds or mixtures thereof, as explained above with respect to rod 26. Rods 84, 86 and 88, respectively, have rod ends 96, 98 and 100, which are shown as being introduced by rod supports 90, 92 and 94, into laser beams 72, 74 and 76, respectively, where they are each melted by their respective laser beam. Rods 84, 86 and 88 are each grounded as shown. Then, analogously to the means provided by ring electrode 28 and its associated variable power supply 30, of FIG. 1, a multiplicity of ring electrodes 102, 104 and 106 and a respective multiplicity of variable power supplies 108, 110 and 112 are shown employed to separately apply an individually controllable electric field to each of molten rod ends 96, 98 and 100, respectively, and respectively eject therefrom charged particles 114, 116 and 118, which particles may be droplets, atomic clusters comprised of several atoms, single molecules, or single atoms. The descriptions of ring electrode 28 and variable power supply 30, supra, FIG. 1, apply equally to ring electrodes 102, 104 and 106 and to variable power supplies 108, 110 and 112, respectively. Further, analogously to the means provided by disk electrode 34 and variable power supply 36, of FIG. 1, charged particles 114, 116 and 118, respectively are linearly accelerated, or given kinetic energy, by disk electrodes 120, 122 and 124 as energized by variable power supplies 126, 128 and 130, respectively. And, analogously to the means provided by sweep plates 38 and variable power supply 40, of FIG. 1, charged particles 114, 116 and 118 respectively, are given a transverse acceleration by sweep plates 132, 134 and 136 as energized by variable power supplies 138, 140 and 142, respectively. The descriptions of disk electrode 34 and sweep plates 38, and their related variable power supplies, supra of FIG. 1, apply equally to the disk electrodes, sweep plates, and their related power supplies, of FIG. 2. Disk electrodes 120, 122 and 124 and the respective sweep plates 132, 134 and 136, together with their respective power supplies, provide an electrode structure that produces electric potentials that separately transport charged particles 114, 116 and 118 onto a substrate 146 to form a coating 144, as shown. By controlling the kinetic energy, relative quantity, and size—which may vary from charged droplets to charged single atoms—of charged particles 114, 116 and 118 the nature and character of coating 144 may be controlled. Since more or less of any material can be applied simultaneously with other materials to form coating 144, layered or thickness graded substances of hithereto unavailable compositions may be generated of materials which normally do not form compounds or viable solutions. It is further noted that substrate 146 may be liquid.

It is thus appreciated that in accordance with the invention as herein described and shown in FIGS. 1 and 2, a method or process of producing regulated, multi-material, composite coatings of variable composition and configuration is provided. The method includes applying pure coatings of very high melting temperature, and coatings created from charged droplets, charged atomic clusters, charged single molecules, and/or charged single atoms, to various substrates including liquid surfaces.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method, for use in a controlled environment, for applying a coating to a substrate, the method comprising the steps of:

melting an end of each of a multiplicity of two or more rods with a multiplicity of focused beams of laser light, with each of the rods comprised of one or more materials selected from the group consisting of any refractory, any metal, any glass, any polymeric substance, and any inorganic salt;

ejecting charged atomic clusters, charged single molecules, or charged single atoms, or any combination thereof, from each of the molten ends of the multiplicity of rods, by separately applying an individual electric field, from a multiplicity of electric fields, to each of the molten ends of the multiplicity of rods, with the individual intensity of each of the separately applied electric fields being individually controllable; and separately transporting the clusters, molecules, or atoms ejected from each molten rod end, by accelerating the clusters, molecules, or atoms with electric potentials that are produced by an electrode structure, with the electric potentials transporting the clusters, molecules, or atoms from each individual molten rod end being individually controllable, onto the substrate to form the coating.

* * * * *